United States Patent
Ong et al.

(10) Patent No.: US 7,595,984 B2
(45) Date of Patent: Sep. 29, 2009

(54) SUPPORT TRAY WITH FOLD-AWAY HANDLES

(75) Inventors: Brett C. Ong, San Jose, CA (US); Andrew P. Tosh, Maynard, MA (US); William A. De Meulenaere, Newark, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 569 days.

(21) Appl. No.: 11/429,517

(22) Filed: May 4, 2006

(65) Prior Publication Data

US 2007/0258226 A1 Nov. 8, 2007

(51) Int. Cl.
*H05K 7/00* (2006.01)

(52) U.S. Cl. .................. 361/683; 361/752; 361/796; 361/801

(58) Field of Classification Search .................. 361/683, 361/719, 752, 796, 801; 174/542
See application file for complete search history.

(56) References Cited

U.S. PATENT DOCUMENTS

| | | | | |
|---|---|---|---|---|
| 3,813,004 A | * | 5/1974 | Andreaggi | 220/756 |
| 4,428,610 A | * | 1/1984 | Guffey | 294/1.3 |
| 4,881,361 A | * | 11/1989 | Dalton | 56/17.5 |
| 5,392,192 A | * | 2/1995 | Dunn et al. | 361/683 |
| 5,641,296 A | * | 6/1997 | Larabell et al. | 439/342 |
| 5,767,445 A | * | 6/1998 | Wu | 174/542 |
| 6,366,471 B1 | * | 4/2002 | Edwards et al. | 361/796 |
| 6,443,322 B1 | * | 9/2002 | Braun et al. | 220/4.02 |
| D484,509 S | * | 12/2003 | Frank et al. | D14/441 |
| 6,816,391 B2 | * | 11/2004 | Davis et al. | 361/818 |
| 7,102,883 B2 | * | 9/2006 | Hardt et al. | 361/679.32 |
| 7,113,406 B1 | * | 9/2006 | Nguyen et al. | 361/719 |
| 7,213,806 B2 | * | 5/2007 | Mitchell | 269/289 R |
| 7,240,967 B2 | * | 7/2007 | Wade | 297/440.1 |
| 7,297,008 B2 | * | 11/2007 | Griffin | 439/157 |
| 7,317,613 B2 | * | 1/2008 | Quijano et al. | 361/686 |
| 2004/0242078 A1 | * | 12/2004 | Brovald et al. | 439/701 |
| 2005/0219823 A1 | * | 10/2005 | Yu et al. | 361/704 |

* cited by examiner

*Primary Examiner*—Dean A. Reichard
*Assistant Examiner*—Xiaoliang Chen
(74) *Attorney, Agent, or Firm*—Osha • Liang LLP

(57) ABSTRACT

A support tray with fold-away handles is disclosed. When the support tray (which may be used to support a printed circuit board) is installed into a computer chassis, the handles are put into an upright position in which the handles extend above the support tray. In this position, the handles can be held by a user to easily lower the support tray into the chassis. When the support tray is not installed in a chassis (e.g. when the support tray is being shipped), the handles are put into a fold-away position in which the handles are situated underneath the support tray. This enables the support tray to maintain a low profile when the handles are not in use.

18 Claims, 9 Drawing Sheets

SUPPORT TRAY WITH FOLD-AWAY HANDLES

BACKGROUND

In recent years, computer systems have become increasingly complex. With greater complexity has come greater component density on the printed circuit boards (PCB's). This greater density has added more weight to the PCB's, which has put more stress on the substrate. To make matters worse, heavyweight heat sinks have been added to PCB's to cool components, such as microprocessors, that generate significant amounts of heat. This additional weight has resulted in even more mechanical stress being imposed on the substrate. This increased stress can cause the PCB to bend, which can lead to severing of electrical contacts and even component damage. To prevent this from happening, PCB's are often mounted onto rigid support trays that provide mechanical support for the PCB'S.

When it comes time to install the PCB into a computer chassis, the entire assembly, including the PCB and the support tray, is typically installed. Because of the weight of the assembly (which can be upward of six to ten pounds or even more), and because of the tight dimensions of the chassis, installation can be difficult. To install the assembly into the chassis, a user has to lower the assembly into the chassis. When doing this, the user typically cannot hold onto the sides of the assembly (due to the tight dimensions of the chassis). This means that the user has to hold on to some small portion of the PCB or the support tray when lowering the assembly into the chassis. Given the weight of the assembly, this can be difficult to do. The user could grab hold of some of the components on the PCB, such as the heat sink, but this is undesirable because it could tear off or damage the components.

To facilitate the installation process, some support trays have provided some small knobs that the user can hold on to when lowering the assembly into the chassis. While this is better than nothing, it is still not a wholly satisfactory solution because, even with the knobs, the assembly is difficult to hold and maneuver. Because of the shortcomings of the current support trays, an improved support tray design is needed to make the installation process easier and more convenient.

SUMMARY

In accordance with one embodiment of the present invention, there is provided a support tray with fold-away handles. When the support tray (and its corresponding PCB) is installed into a computer chassis, the handles are put into an upright position in which the handles extend above the support tray. In this position, the handles can be held by a user to easily lower the support tray into the chassis. When the support tray is not installed in a chassis (e.g. when the support tray is being transported), the handles are put into a fold-away position in which the handles are situated underneath the support tray. With the handles in the fold-away portion, the support tray maintains a low profile. Thus, this support tray provides the best of both worlds. When needed, the handles can be put into the upright position and used to easily install the support tray into a chassis. When not needed, the handles can be folded away to take up as little space as possible. This support tray design represents a significant improvement over the prior art.

DETAILED DESCRIPTION OF EMBODIMENT(S)

Top Perspective View

Figure 1:
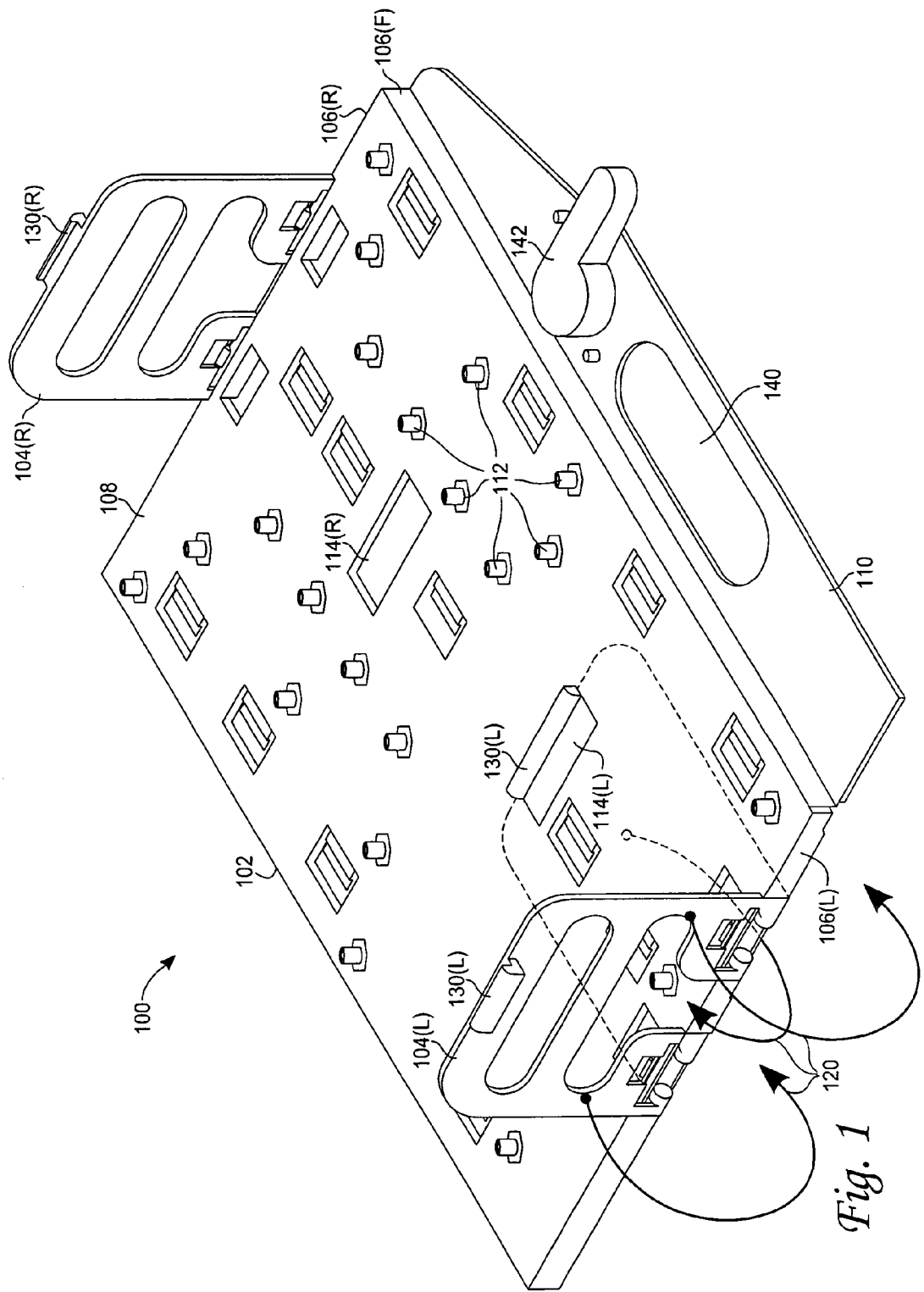
FIG. 1 shows a top perspective view of a support tray, in accordance with one embodiment of the present invention.

With reference to FIG. 1, there is shown a top perspective view of a support tray 100 in accordance with one embodiment of the present invention. As shown, the support tray 100 comprises a base 102, a plurality of handles 104 attached to the base 102, and an extension portion 110. For the sake of illustration, only two handles 104 are shown; however, more handles 104 may be attached to the base 102, if so desired. In one embodiment, the base 102 is composed of a rigid material. For purposes of the present invention, this rigid material may be any type of material including, but not limited to, sheet metal, etc.

In one embodiment, the base 102 comprises a plurality of mounting structures 112 attached to and protruding from the top surface 108 of the base 102 (note: to avoid cluttering the figure, only some of the mounting structures are labeled with the reference number 112). In one embodiment, at least some if not all of these mounting structures 112 are hollow and threaded to enable a screw to be inserted therein. These mounting structures 112 are intended to support a PCB, and to enable the PCB to be attached (by way of screws) to the support tray 100. In one embodiment, the base 102 also comprises two openings 114 near the middle portion of the base 102. As will be discussed further below, these openings 114 enable the handles 104 to be clipped, and thus, secured to the base 102 when the handles 104 are put into a fold-away position.

In one embodiment, the handles 104 are rotatably attached to the edges of the base 102. As shown in FIG. 1, a right handle 104(R) is rotatably attached to the right edge 106(R) of the base 102, and a left handle 104(L) is rotatably attached to a left edge 106(L) of the base 102. Attached in this manner, each handle 104 may be rotated around an axis formed by its corresponding edge 106, as shown by the arrows 120 with respect to handle 104(L). Specifically, the handles 104 may be rotated into an upright position (as shown in FIG. 1) in which the handles 104 extend above the top surface 108 of the base 102. When in this position, the handles 104 may be used by a user to lift/lower/carry the support tray 100. The handles 104 may also be rotated into a fold-away position in which the handles 104 are situated beneath the base 102 and contact a bottom surface of the base 102. The dashed shadow lines of FIG. 1 show the handle 104(L) when it is in the fold-away position. When in this position, the handles 104 take up minimal space, and enable the support tray 100 to maintain a very low profile. As shown in FIG. 1, when the left handle 104(L) is in the fold-away position, the clip 130(L) at the end of the handle 104(L) enters the left opening 114(L) of the base 102 from below, and clips onto a side of the opening 114(L). This serves to secure the handle 104(L) to the base 102 when the handle 104(L) is in the fold-away position. The right handle 104(R) may be put into a fold-away position, and may be clipped to a side of the right opening 114(R) of the base 102 in a similar fashion.

Underside Perspective View

Figure 2:
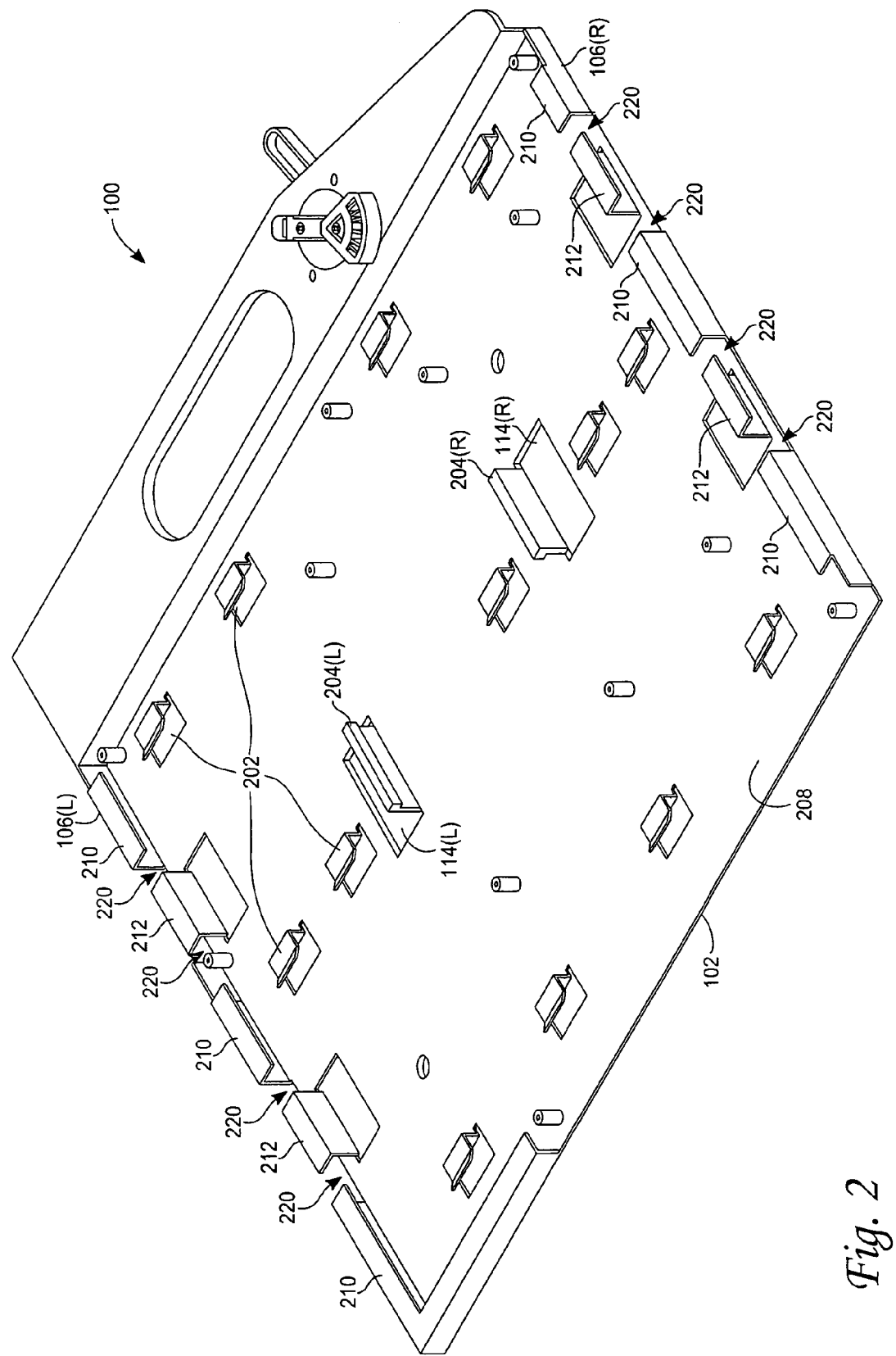
FIG. 2 shows a perspective view of an underside of the support tray of FIG. 1, in accordance with one embodiment of the present invention.

FIG. 2 shows a perspective view of an underside of the support tray 100, in accordance with one embodiment of the present invention. For the sake of simplicity, the handles 104 are not shown in FIG. 2.

In one embodiment, the base 102 has a bottom surface 208 and a plurality of hooks 202 protruding from the bottom surface 208 (note: to avoid cluttering the figure, only some of the hooks are labeled with the reference number 202). These hooks 202 are intended to mate with corresponding structures in a computer chassis when the support tray 100 is installed into a computer chassis. The base 102 further comprises guides 204 that extend from the bottom surface 208. These guides 204 are used when the handles 104 (FIG. 1) are placed in the fold-away position. Specifically, when the handles 104 are folded away, the guides 204 contact the clips 130 of the handles 104, and guide them towards the openings 114 in the base 102. This helps the clips 130 to enter the appropriate openings 114, and to clip onto a side thereof.

In addition to the structures already mentioned, the base 102 further comprises structures that enable the handles 104 to be rotatably attached to the edges 106 of the base 102. In FIG. 2, these structures are labeled with the reference numbers 210 and 212. Specifically, on the right edge 106(R) of the base 102, there are three structures 210 that extend from the bottom of the base 102 and curl inward. There are also two structures 212 that extend from the bottom of the base 102 and curl outward. Together, these structures 210, 212 define a plurality of retaining slots 220. As will be discussed further below, it is these retaining slots 220 that accommodate the ends of the right handle 104(R), and enable the right handle 104(R) to be rotatably attached to the right edge 106(R) of the base 102. Similar structures 210, 212 exist along the left edge 106(L) of the base 102. These structures 210, 212 form similar retaining slots 220 that accommodate the ends of the left handle 104(L), and enable the left handle 104(L) to be rotatably attached to the left edge 106(L) of the base 102.

In the above description, very specific structures are disclosed. It should be noted, though, that this is for illustration only. For purposes of the present invention, many other structures may be used to enable the handles 104 to be rotatably attached to the edges 106 of the base 102. All such structures are within the scope of the present invention.

Handles

Figure 3:
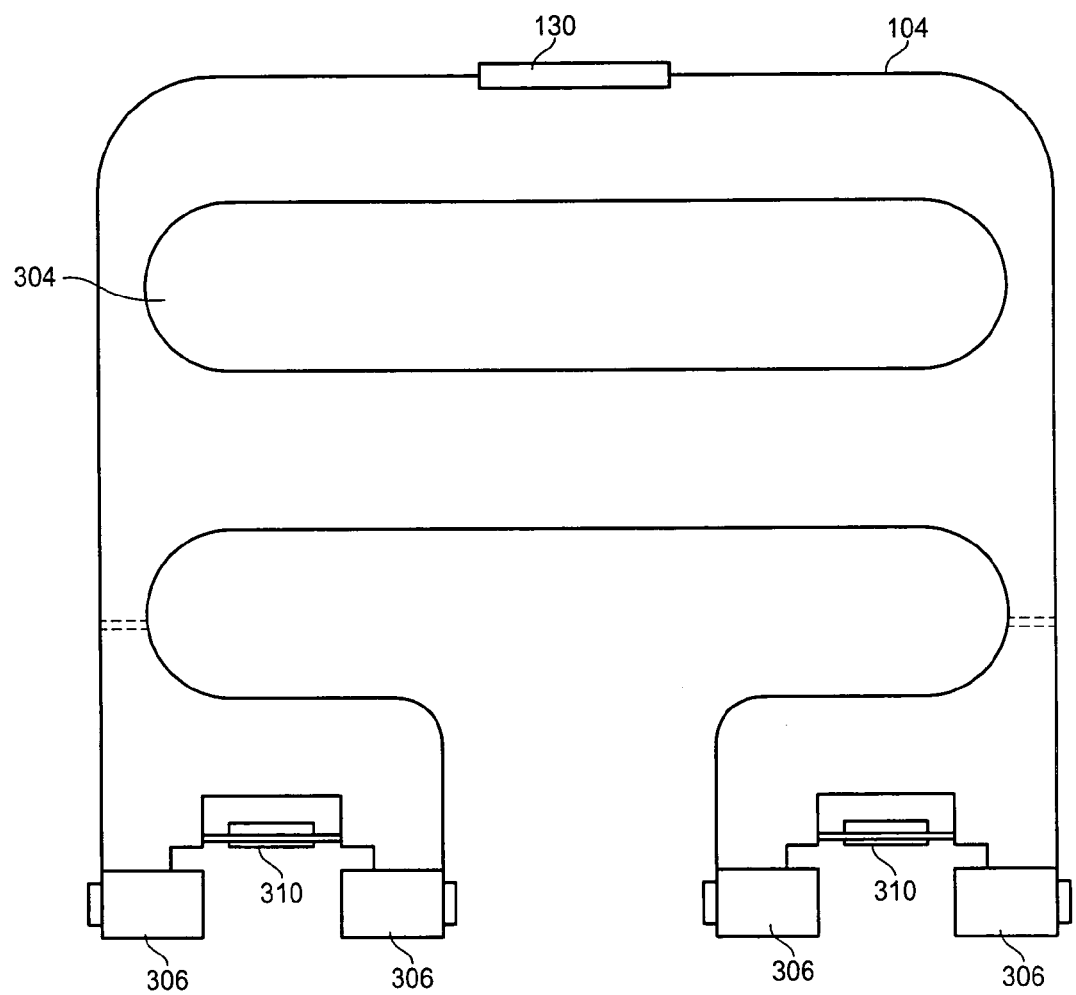
FIG. 3 shows a frontal view of a handle, in accordance with one embodiment of the present invention.

With reference to FIG. 3, there is shown a frontal view of a handle 104, in accordance with one embodiment of the present invention. The handle 104 shown in FIG. 3 may be either the right handle 104(R) or the left handle 104(L). In one embodiment, a handle 104 takes the form of a relatively thin flap of semi-rigid, flexible material. This material may be, for example, plastic, metal, or any other type of semi-rigid, flexible material.

In one embodiment, the handle 104 comprises one or more cutout portions 304. A user may insert one or more fingers through this cutout portion 304 to obtain a firm grip on the handle 104. In one embodiment, the handle 104 further comprises a plurality of substantially cylindrical stubs 306. As will discussed further below, it is these stubs 306 that insert into the retaining slots 220 (FIG. 2) along one of the edges 106 of the base 102 to enable the handle 104 to be rotatably attached to that edge.

The handle 104 may further comprise one or more tabs 310 and a clip 130. The function of the tabs 310 will be disclosed in a later section, and the function of the clip 130 has already been discussed.

Figures 4A, 4B:
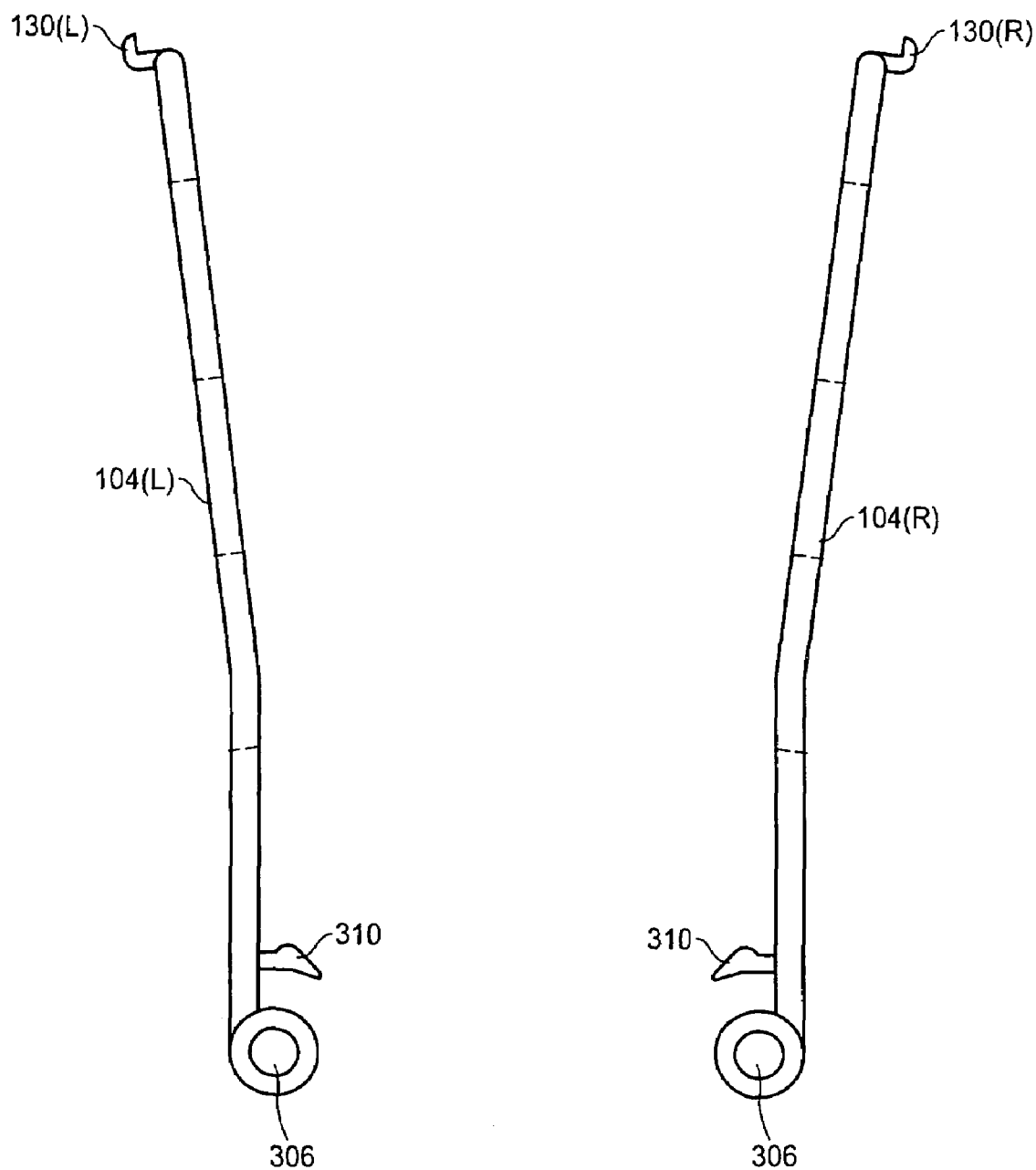
FIGS. 4a and 4b show a side view of a left handle and a side view of a right handle, respectively, in accordance with one embodiment of the present invention.

With reference to FIGS. 4a and 4b, there is shown a side view of a left handle 104(L) and a side view of a right handle 104(R), respectively. As shown in FIGS. 4a and 4b, in one embodiment, each of the handles 104 is bent slightly outward. Bent in this way, the handles 104 are "pre-tensioned". The significance of this will be made clear in a later section.

Attachment of the Handles to the Base

Figure 5:
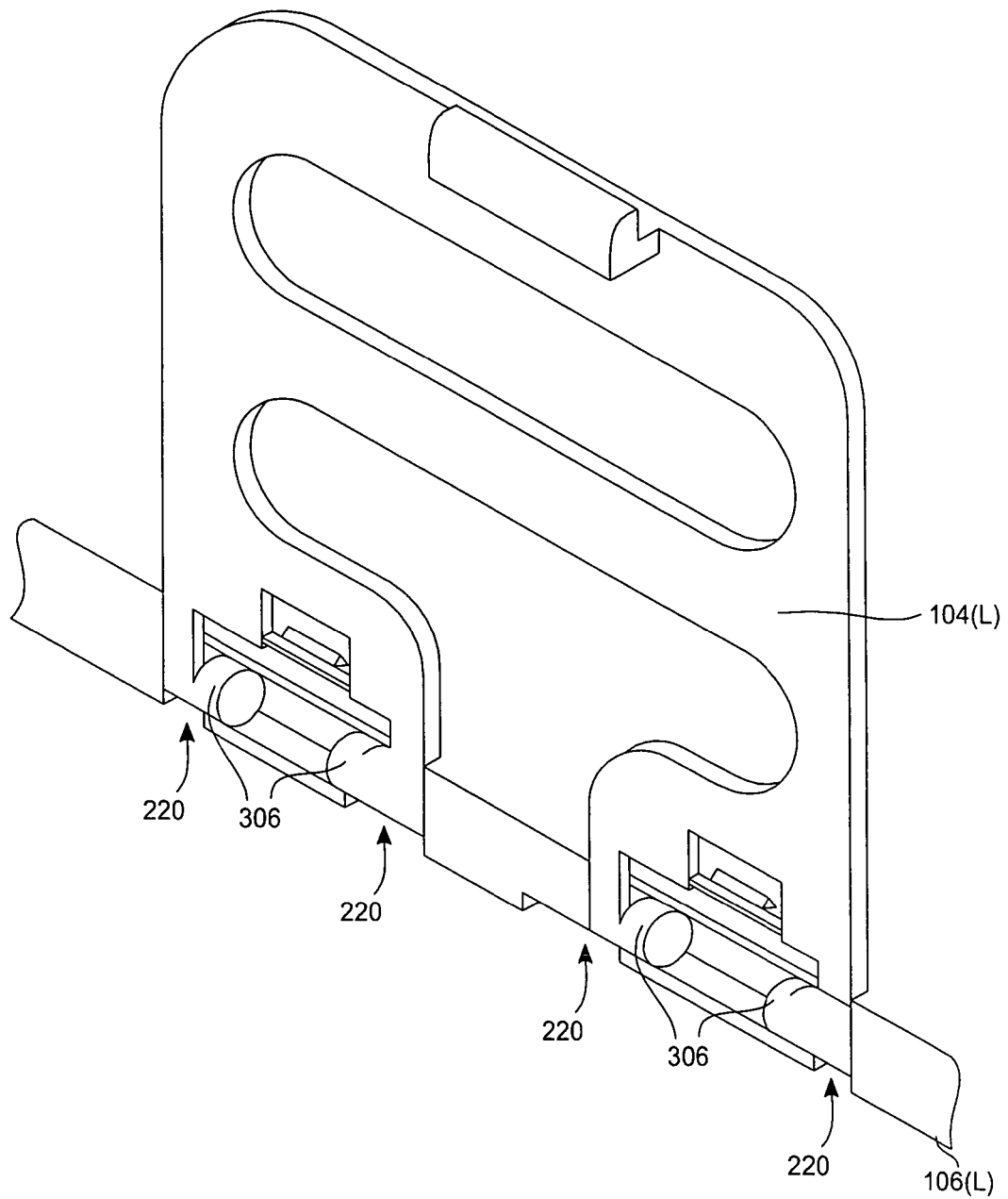
FIG. 5 shows a perspective view of a left edge of the support tray of FIG. 1, to illustrate the manner in which a left handle may be rotatably attached to the left edge, in accordance with one embodiment of the present invention.

With reference to FIG. 5, there is shown a perspective view of the left edge 106(L) of the base 102, to illustrate the manner in which the left handle 104(L) may be rotatably attached to the left edge 106(L), in accordance with one embodiment of the present invention. While FIG. 5 specifically shows attachment of the left handle 104(L) to the left edge 106(L), it should be noted that the right handle 104(R) may be attached to the right edge 106(R) in a similar fashion.

As shown, the handle 104(L) is attached to the edge 106(L) by inserting the stubs 306 at the end of the handle 104(L) into the retaining slots 220 underneath the edge 106(L). Because the retaining slots 220 are defined by structures that curl inward 210 (FIG. 2) and outward 212, and because each of the stubs 306 contacts both a structure 210 that curls inward and a structure 212 that curls outward, the stubs 306 are held in place by the structures 210, 212. Furthermore, because the stubs 306 are substantially cylindrical in shape, they allow the handle 104(L) to rotate around an axis formed by the edge 106(L). Thus, the handle 104(L) is rotatably attached to the edge 106(L).

Notice from this embodiment that the handle 104(L) is effectively attached to the underside of the base 102. Because of this, when the handle 104(L) is rotated to the upright position as shown in FIG. 5, the side of the handle 104(L) will come into contact with the edge 106(L) of the base 102. As a result, the edge 106(L) will effectively stop the handle 104(L) from rotating beyond the upright position towards the top surface 108 of the base 102. This in turn will prevent the handle 104(L) from falling onto the top surface 108 of the base 102, which is advantageous.

Figure 6:
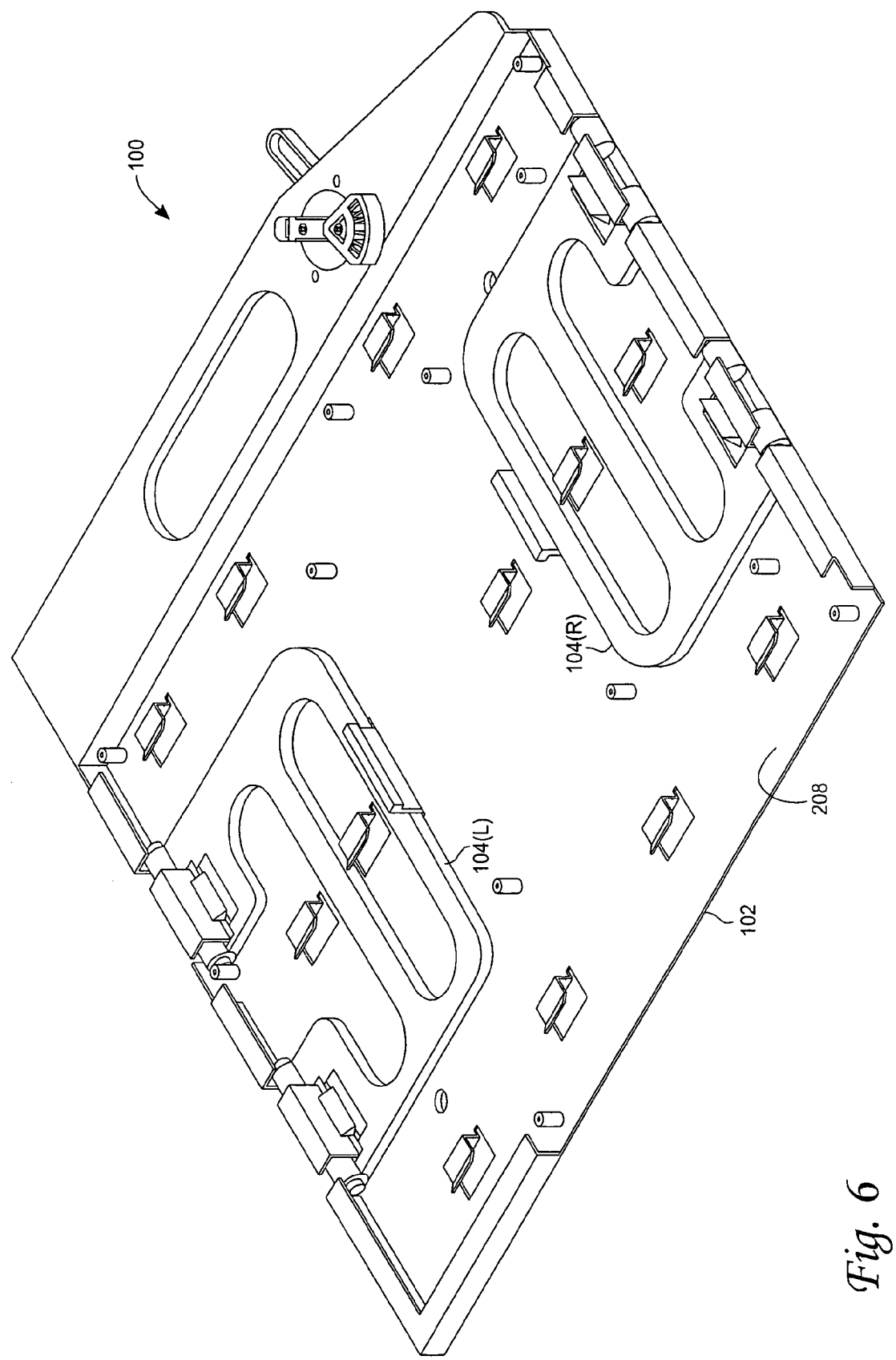
FIG. 6 shows a perspective view of an underside of the support tray of FIG. 1 in which handles are rotated into a flow-away position, in accordance with one embodiment of the present invention.

After the handles 104 are attached to the edges 106 of the base 102, they may be freely rotated. FIG. 1 shows the handles 104 rotated into the upright position. FIG. 6 shows the handles 104 rotated into the fold-away position. As can be seen, when the handles 104 are in the fold-away position, they contact the bottom surface 208 of the base 102 and take up minimal space. As a result, the support tray 100 can maintain a very low profile when the handles 104 are not in use.

PCB and Support Tray Assembly

Figure 7:
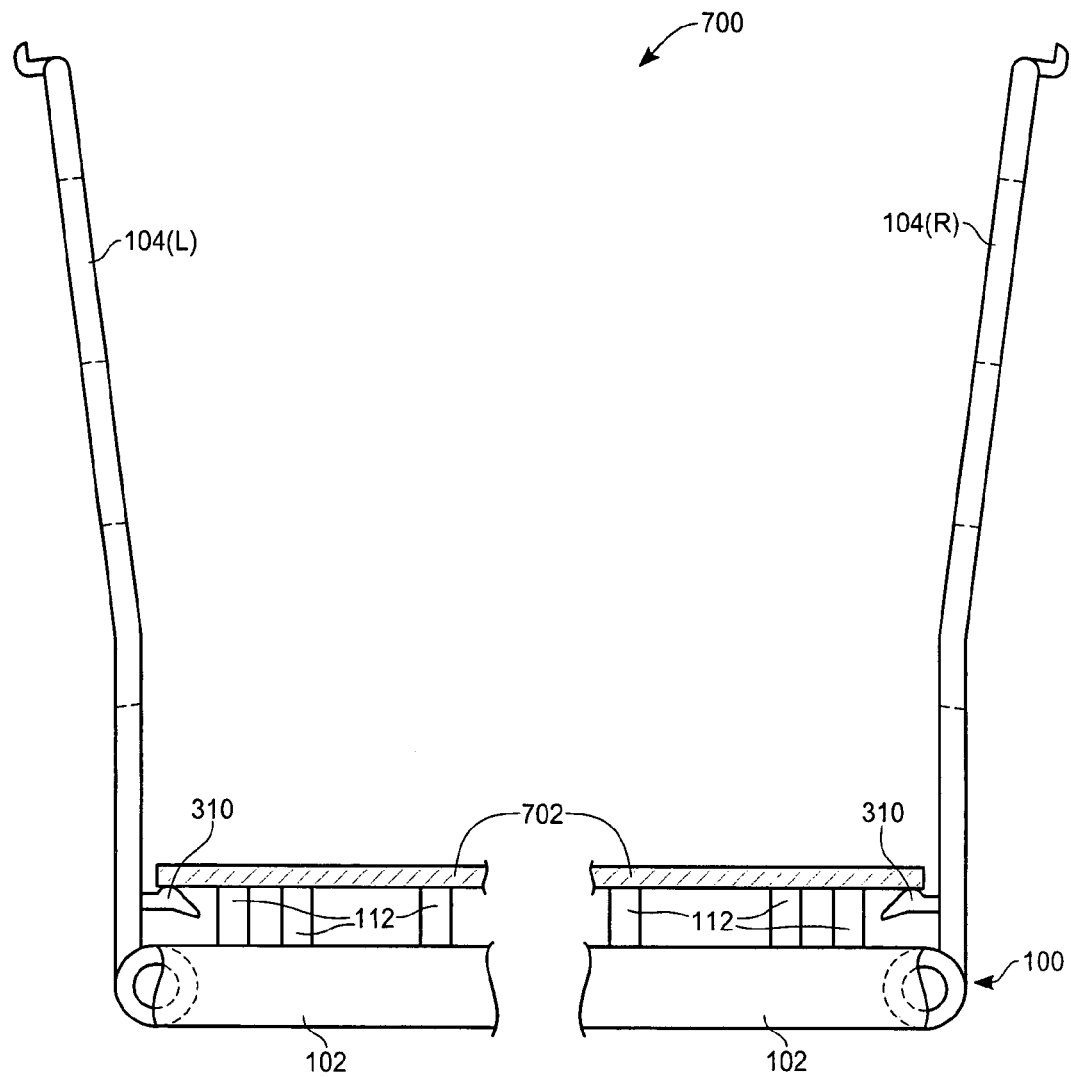
FIG. 7 shows a frontal view of an assembly comprising a PCB and the support tray of FIG. 1, in accordance with one embodiment of the present invention.

With reference to FIG. 7, there is shown a frontal view of an assembly 700 formed by attaching a PCB 702 to the support tray 100. In such an assembly 700, the PCB 702 may be any type of PCB, including but not limited to a motherboard. As shown, the PCB 702 sits on top of and is attached to the support structures 112 protruding from the base 102. The PCB 702 may be attached via screws. After the PCB 702 is attached, the handles 104 may be rotated into the upright position as shown. When this is done, the tabs 310 of the handles 104 slip under the PCB 702. This has the effect of holding the handles 104 in the upright position. Thus assembled, the assembly 700 is ready to be installed in a computer chassis. With the handles 104 in the upright position, a user can use the handles 104 to easily and conveniently lower the assembly 700 into the chassis.

Figure 8:
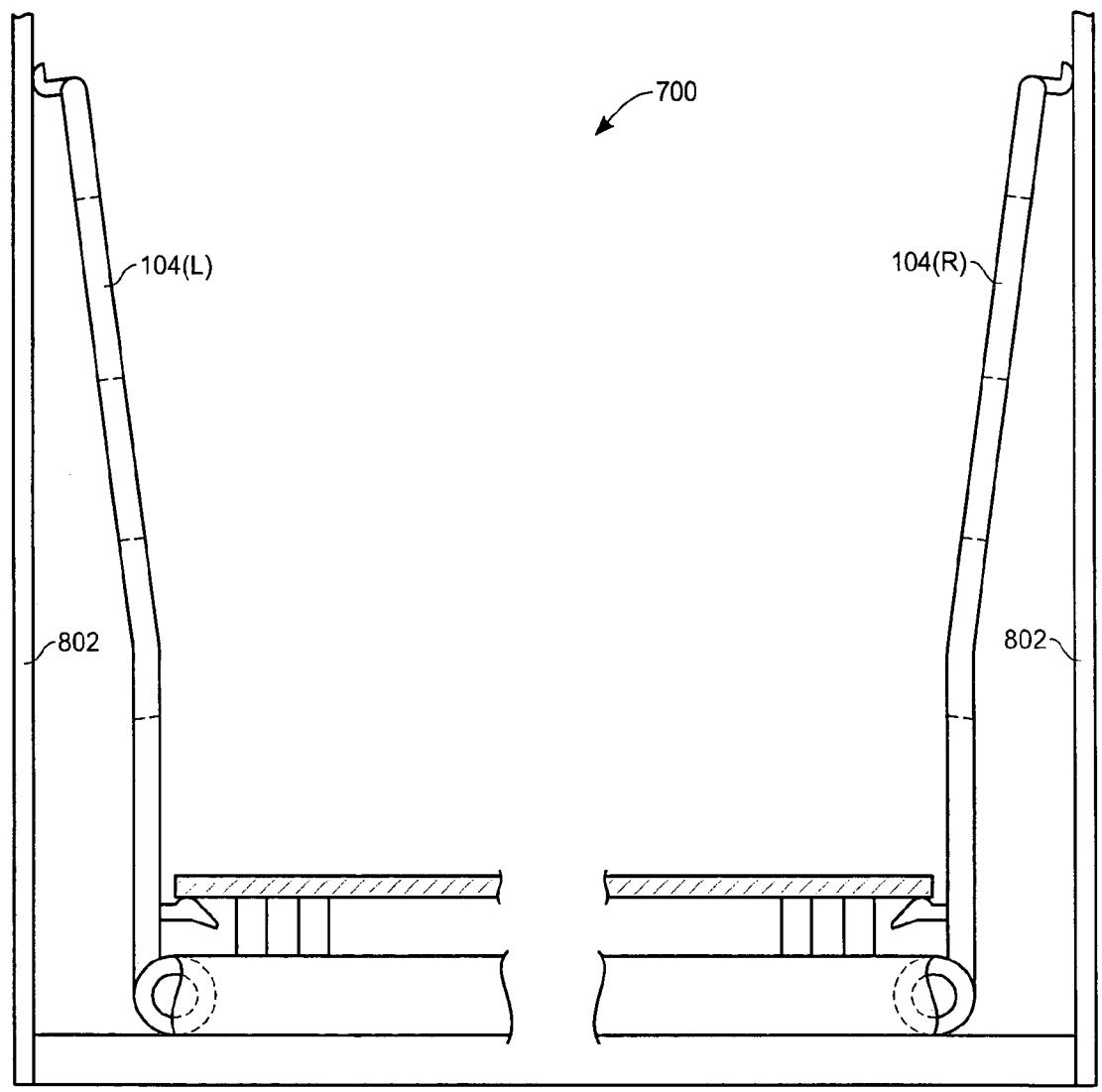
FIG. 8 shows a frontal view of the assembly of FIG. 7 and a computer chassis after the assembly has been installed into the chassis, in accordance with one embodiment of the present invention.

FIG. 8 shows a frontal view of the assembly 700 and a computer chassis after the assembly 700 has been installed into the chassis. As shown, after the assembly 700 is installed, the handles 104 stay in the upright position. Furthermore, because the handles 104 are bent outward, and hence, are "pre-tensioned", they press against the walls 802 of the chassis. This prevents the handles 104 from moving around or rattling after the assembly 700 is installed.

Extension Portion

As shown in FIG. 1, one embodiment of the support tray 100 comprises an extension portion 110 situated along a front edge 104(F) of the base 102. In one embodiment, the extension portion 110 comprises a cutout portion 140 and a cam 142. The cutout portion 140 allows a user to insert one or more fingers therethrough to obtain a firm hold of the support tray 100. This cutout portion 140 may be used as a handle to carry the support tray 100 when the handles 104 are in put into the fold-away position.

Figure 9A:
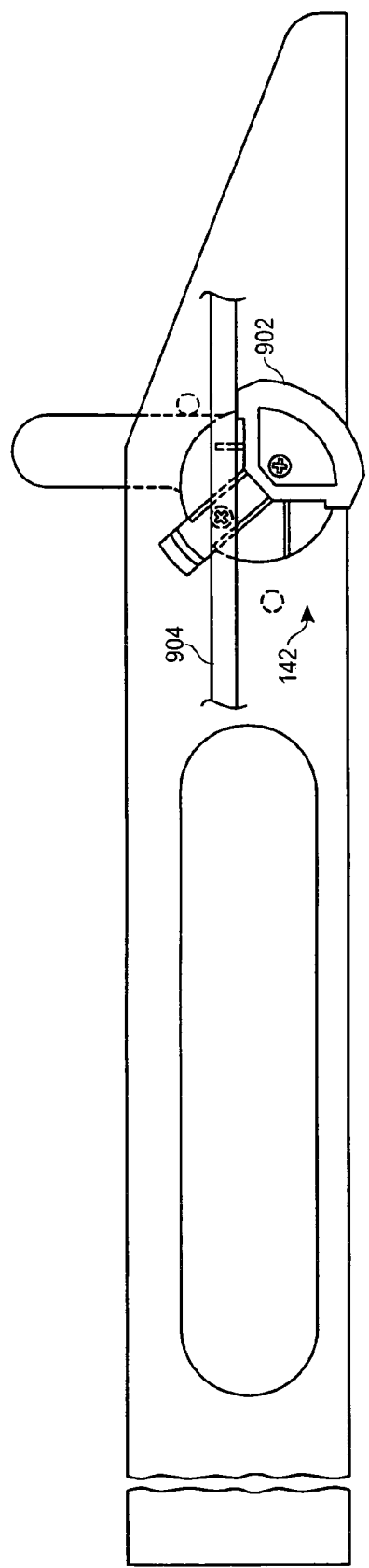
FIGS. 9a-9b show various views of an extension portion, in accordance with one embodiment of the present invention.
Figure 9B:
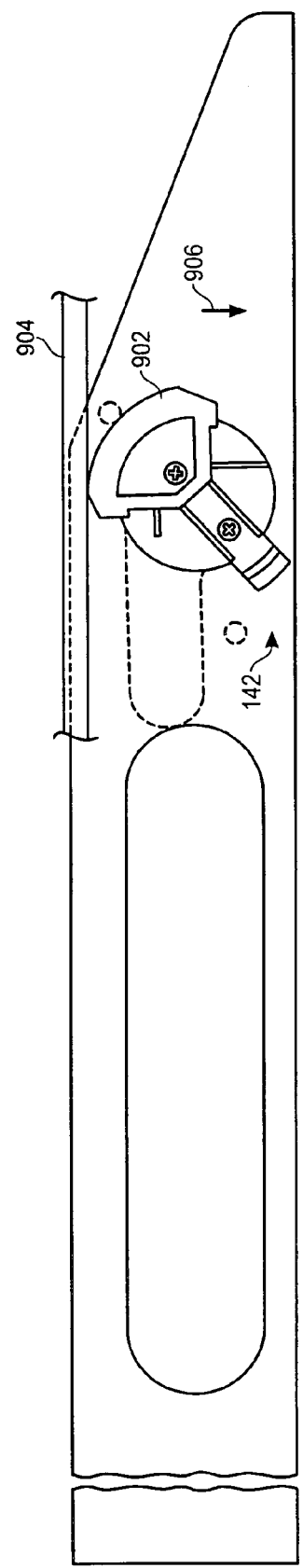

With regard to the cam 142, it is intended to facilitate the securing of the support tray 100 to a computer chassis. The function of the cam 142 will be described with reference to FIGS. 9a and 9b. FIG. 9a shows an underside view of the cam 142. When the cam 142 is in the open position, as shown in FIG. 9a, the "wheel" 902 of the cam 142 is in a lower position. When the cam 142 is in the closed position, as shown in FIG. 9b, the wheel 902 of the cam 142 is in a higher position. Thus, if the wheel 902 of the cam 142 is placed in contact with a low retaining wall 904 of a chassis while in the open position (as shown in FIG. 9a), then when the cam 142 is put in the closed position, the wheel 904 of the cam 142 will move up and push against the low retaining wall 904 of the chassis. This has the effect of pushing the entire support tray in the direction indicated by arrow 906. As a practical consequence, this causes the hooks 202 (FIG. 2) on the underside of the base 102 to mate with their corresponding structures in the chassis to secure the support tray 100 to the chassis. In this manner, the cam 142 facilitates the securing process.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the issued claims and the equivalents thereof.

What is claimed is:

1. A support tray, comprising:
   a rigid base having a top surface, a bottom surface opposite the top surface, a first edge, and a second edge;
   a first handle rotatably attached to the base along the first edge;
   a second handle rotatably attached to the base along the second edge;
   wherein the first and second handles can be rotated into an upright position in which the first and second handles extend above the top surface of the base,
   wherein the first and second handles can also be rotated into a fold-away position in which the first and second handles are situated beneath the base and contact the bottom surface of the base, and
   wherein the first and second handles are adapted to rotate from the fold-away position to the upright position through over 180 degrees of rotation,
   one or more hooks protruding from the bottom surface of the base for attaching to one or more corresponding structures of a computer chassis when the support tray is installed in the computer chassis, wherein the base further comprises a third edge, and wherein the support tray further comprises an extension portion situated along the third edge, the extension portion having a cutout portion therein to be used as a handle for carrying the support tray, and
   a cam attached to the extension portion for facilitating installation of the support tray into a computer chassis, wherein the cam, when closed, pushes against a wall of the computer chassis causing the support tray to move in a direction to secure the support tray to the computer chassis by attaching the one or more hooks of the support tray to the one or more corresponding structures of the computer chassis.

2. The support tray of claim 1, wherein the first handle is rotatably attached to the base in such a manner that the first edge stops the first handle from rotating beyond the upright position towards the top surface of the base, thereby preventing the first handle from falling onto the top surface of the base.

3. The support tray of claim 2, further comprising:
   one or more structures for defining one or more retaining slots beneath the base along the first edge,
   wherein the one or more retaining slots are defined by inward curling structures and outward curling structures disposed along the first edge.

4. The support tray of claim 1, wherein the base comprises an opening, and wherein the first handle comprises a clip that clips onto a side of the opening when the first handle is rotated into the fold-away position to secure the first handle to the base, wherein the first handle as secured is substantially parallel to the base and perpendicular to a direction of rotation.

5. The support tray of claim 1, further comprising:
   a plurality of attachment structures protruding from the top surface of the base for enabling a printed circuit board to be attached thereto.

6. The support tray of claim 5, wherein at least one of the attachment structures is hollow and threaded to enable a screw to be inserted therein.

7. The support tray of claim 1, wherein the first handle comprises a flap having a cutout portion therein.

8. The support tray of claim 7, wherein the flap has a bend therein that bends outward away from the base when the first handle is in the upright position.

9. A support tray, comprising:
a rigid base having a top surface, a bottom surface opposite the top surface, a first edge, and a second edge;
a first handle rotatably attached to the base along the first edge;
a second handle rotatably attached to the base along the second edge; and
one or more structures for defining one or more retaining slots beneath the base along the first edge,
wherein the first and second handles can be rotated into an upright position in which the first and second handles extend above the top surface of the base,
wherein the first and second handles can also be rotated into a fold-away position in which the first and second handles are situated beneath the base and contact the bottom surface of the base,
wherein the first and second handles are adapted to rotate from the fold-away position to the upright position through over 180 degrees of rotation,
wherein the first handle is rotatably attached to the base in such a manner that the first edge stops the first handle from rotating beyond the upright position towards the top surface of the base, thereby preventing the first handle from falling onto the top surface of the base,
wherein the one or more retaining slots are defined by inward curling structures and outward curling structures disposed along the first edge, and
wherein the first handle has one or more stubs at a first end of the first handle, and wherein the one or more stubs are inserted into the one or more retaining slots to attach the first handle to the base and to enable the first handle to rotate around an axis formed by the first edge, wherein the one or more stubs are held in place by the inward curling structures and the outward curling structures.

10. A support tray, comprising:
a rigid base having a top surface, a bottom surface opposite the top surface, a first edge, and a second edge;
a plurality of attachment structures protruding from the top surface of the base for enabling a printed circuit board to be attached thereto, at least one of the attachment structures being hollow and threaded to enable a screw to be inserted therein;
a first handle rotatably attached to the base along the first edge;
a second handle rotatably attached to the base along the second edge,
wherein the first and second handles can be rotated into an upright position in which the first and second handles extend above the top surface of the base,
wherein the first and second handles can also be rotated into a fold-away position in which the first and second handles are situated beneath the base and contact the bottom surface of the base,
wherein the first and second handles are adapted to rotate from the fold-away position to the upright position through over 180 degrees of rotation, and
wherein the first and second handles are rotatably attached to the base in such a manner that the base stops the first and second handles from rotating beyond the upright position towards the top surface of the base, thereby preventing the first and second handles from falling onto the top surface of the bases,
one or more hooks protruding from the bottom surface of the base for attaching to one or more corresponding structures of a computer chassis when the support tray is installed in the computer chassis, wherein the base further comprises a third edge, and wherein the support tray further comprises an extension portion situated along the third edge, the extension portion having a cutout portion therein to be used as a handle for carrying the support tray; and
a cam attached to the extension portion for facilitating installation of the support tray into a computer chassis, wherein the cam, when closed, pushes against a wall of the computer chassis causing the support tray to move in a direction to secure the support tray to the computer chassis by attaching the one or more hooks of the support tray to the one or more corresponding structures of the computer chassis.

11. The support tray of claim 10, wherein the base comprises a first opening and a second opening, wherein the first handle comprises a first clip and the second handle comprises a second clip, wherein the first clip clips onto a side of the first opening when the first handle is rotated into the fold-away position to secure the first handle to the base, and wherein the second clip clips onto a side of the second opening when the second handle is rotated into the fold-away position to secure the second handle to the base, wherein the first and second handles as secured are substantially parallel to the base and perpendicular to a direction of rotation.

12. The support tray of claim 10,
wherein the first handle comprises a first flap having a cutout portion therein, the first flap having a bend that bends outward away from the base when the first handle is in the upright position; and
wherein the second handle comprises a second flap having a cutout portion therein, the second flap having a bend that bends outward away from the base when the second handle is in the upright position.

13. An assembly, comprising:
a rigid base having a top surface, a bottom surface opposite the top surface, a first edge, and a second edge;
a plurality of attachment structures protruding from the top surface of the base, at least one of the attachment structures being hollow and threaded to enable a screw to be inserted therein;
a printed circuit board attached to the attachment structures;
a first handle rotatably attached to the base along the first edge; and
a second handle rotatably attached to the base along the second edge;
wherein the first and second handles can be rotated into an upright position in which the first and second handles extend above the top surface of the base; and
wherein the first and second handles can also be rotated into a fold-away position in which the first and second handles are situated beneath the base and contact the bottom surface of the base,
wherein the first and second handles are adapted to rotate from the fold-away position to the upright position through over 180 degrees of rotation, and
wherein the base further comprises a third edge, and wherein the assembly further comprises;
an extension portion situated along the third edge, the extension portion having a cutout portion therein to be used as a handle for carrying the assembly; and
a cam attached to the extension portion for facilitating installation of the assembly into a computer chassis, wherein the cam, when closed, pushes against a wall of the computer chassis causing the support tray to move in a direction to secure the assembly to the computer chassis by attaching the one or more hooks of the support tray to the one or more corresponding structures of the computer chassis.

14. The assembly of claim 13, wherein the first and second handles are rotatably attached to the base in such a manner that the base stops the first and second handles from rotating beyond the upright position towards the top surface of the base, thereby preventing the first and second handles from falling onto the top surface of the base.

15. The assembly of claim 13, wherein the base comprises a first opening and a second opening, wherein the first handle comprises a first clip and the second handle comprises a second clip, wherein the first clip clips onto a side of the first opening when the first handle is rotated into the fold-away position to secure the first handle to the base, and wherein the second clip clips onto a side of the second opening when the second handle is rotated into the fold-away position to secure the second handle to the base, wherein the first and second handles as secured are substantially parallel to the base and perpendicular to a direction of rotation.

16. The assembly of claim 13,
wherein the first handle comprises a first flap having a cutout portion therein, the first flap having a bend that bends outward away from the base when the first handle is in the upright position; and
wherein the second handle comprises a second flap having a cutout portion therein, the second flap having a bend that bends outward away from the base when the second handle is in the upright position.

17. The assembly of claim 13, wherein the first handle comprises a first tab, wherein the second handle comprises a second tab, wherein the first tab, when the first handle is rotated into the upright position, slips under the printed circuit board to hold the first handle in the upright position, and wherein the second tab, when the second handle is rotated into the upright position, slips under the printed circuit board to hold the second handle in the upright position.

18. The assembly of claim 13, further comprising:
one or more hooks protruding from the bottom surface of the base for attaching to one or more corresponding structures of a computer chassis when the assembly is installed in the computer chassis.

* * * * *

UNITED STATES PATENT AND TRADEMARK OFFICE
CERTIFICATE OF CORRECTION

PATENT NO. : 7,595,984 B2  Page 1 of 1
APPLICATION NO. : 11/429517
DATED : September 29, 2009
INVENTOR(S) : Ong et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 717 days.

Signed and Sealed this

Twenty-eighth Day of September, 2010

David J. Kappos
*Director of the United States Patent and Trademark Office*